(12) United States Patent
Stewart et al.

(10) Patent No.: US 7,573,708 B2
(45) Date of Patent: Aug. 11, 2009

(54) UPSTREAM DUST FILTERS BY RETROFITTING PARALLEL PATH PCB COOLING

(75) Inventors: Thomas E. Stewart, San Diego, CA (US); Timothy W. Olesiewicz, Dublin, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 117 days.

(21) Appl. No.: 11/823,674

(22) Filed: Jun. 28, 2007

(65) Prior Publication Data

US 2009/0002938 A1 Jan. 1, 2009

(51) Int. Cl.
*G06F 1/16* (2006.01)
(52) U.S. Cl. .................. 361/679.54; 126/116; 427/195; 361/679.58

(58) Field of Classification Search .................. 126/116; 427/195; 361/679–687, 724–727
See application file for complete search history.

(56) References Cited

U.S. PATENT DOCUMENTS

| | | | |
|---|---|---|---|
| 2001/0005525 A1* | 6/2001 | Scheufler et al. | 427/195 |
| 2005/0205080 A1* | 9/2005 | Kuroda et al. | 126/116 A |
| 2007/0285886 A1* | 12/2007 | Huang | 361/687 |
| 2008/0151492 A1* | 6/2008 | Maddox | 361/687 |

* cited by examiner

*Primary Examiner*—Hung V Duong
(74) *Attorney, Agent, or Firm*—Osha • Liang LLP

(57) ABSTRACT

An apparatus for cooling a computer system includes a fan for flowing an air to a first assembly and a second assembly, a first filter for filtering an air to a first assembly, and a second filter for filtering an air to a second assembly. The first filter is disposed at a side of the first assembly and the second filter is disposed on an opening of a wall which separates the first assembly and the second assembly.

14 Claims, 8 Drawing Sheets

UPSTREAM DUST FILTERS BY RETROFITTING PARALLEL PATH PCB COOLING

BACKGROUND

FIG. 1 shows a perspective view of a typical computer server 101 with blade servers 103 disposed therein. FIG. 2 shows a perspective view of a computer server 101 in FIG. 1 where blade servers 103 are removed. As can be seen in FIGS. 1 and 2, a chassis 105 has a plurality of slots 107 for enclosing blade servers 103 inside of the chassis 105. Each blade server 103 is removably attached to each socket 201 disposed on a middle wall 203 of a chassis 105. Further, three fan trays 109 are removably disposed under the slots 107 and inside the chassis 105. Each fan tray 109 has an inlet 111 for an air at the front of the fan tray 109.

FIG. 3 shows a sectional view of computer server 101 along the line A-A of FIG. 1. As can be seen in FIG. 3, a front printed circuit board (PCB) assembly 301 of the blade server 103 is disposed at a middle plane 203 of the chassis 105 via the socket 201 so that the front PCB assembly 301 is removably disposed inside the chassis 105, while the rear PCB assembly 307 is fixedly disposed on the rear surface of the middle plane 203. Further, the fan tray 109 is removably disposed inside the chassis 105 under the front PCB assembly 301. The fan tray 109 has an air inlet 111 at the front plane of the fan tray 109 and also has two fans 309 in a row at the upper plate of the fan tray 109 so that the fans 309 provide an air directly to the front PCB assembly 301 as shown in a direction B in FIG. 3. An air filter 311 is disposed between the front PCB assembly 301 and the fans 309 when the fan trays 109 are inserted in the chassis 105. The air filter 311 filters the air from the fans 309 to the front PCB assembly 301. The middle plane 203 of the chassis 305 has an opening 313 beside the back of the fan tray 109 when the fan tray 109 is inserted in the chassis 105 so that the air from the fan is also directed to the rear PCB assembly 307 through the opening 313. In addition, the front PCB assembly 301 and the rear PCB assembly 307 include some electric parts 303 and 305 respectively.

In operation, most of the air from the inlet 111 is directed to the front PCB assembly 301 by the fan 309 as shown in arrow B in FIG. 3, while some of the air from the fans 309 is directed to the rear PCB assembly 307 by the fans 309 through the opening 313 as shown in arrow D in FIG. 3. The air to the front PCB assembly 301 is filtered by the air filter 311, while the air to the rear PCB assembly 307 is not filtered because the rear PCB assembly 307 is not active components and does not require that the air to the rear PCB 307 is filtered.

SUMMARY OF INVENTION

One or more embodiments of the present invention relate to an apparatus for cooling a computer system including a fan for flowing an air to a first assembly and a second assembly, a first filter for filtering an air to a first assembly, and a second filter for filtering an air to a second assembly. The first filter is disposed at a side of the first assembly and the second filter is disposed on an opening of a wall which separates the first assembly and the second assembly.

One or more embodiments of the present invention relate to a method for retrofitting an air filter to a chassis of a computer server having a first front PCB assembly, a rear PCB assembly, a middle wall separating the first front PCB assembly and the second PCB assembly, and a removable fan tray enclosing a fan and having an inlet of an air, wherein the fan provides the air to the first assembly that is disposed above the fan tray when the fan tray is inserted in the chassis. The method includes: removing a fan tray from a chassis of a computer server; making an opening at a rear plate of the fan tray; installing the air filter to the surface of the rear plate around the opening to cover the fan tray; and returning the fan tray to the chassis so that the air filter is attached to an opening of the middle wall to provide a air from the inlet to the second assembly through the air filter.

Other aspects and advantageous of the invention will be apparent from the following description and appended claims.

DETAILED DESCRIPTION

Figure 1:
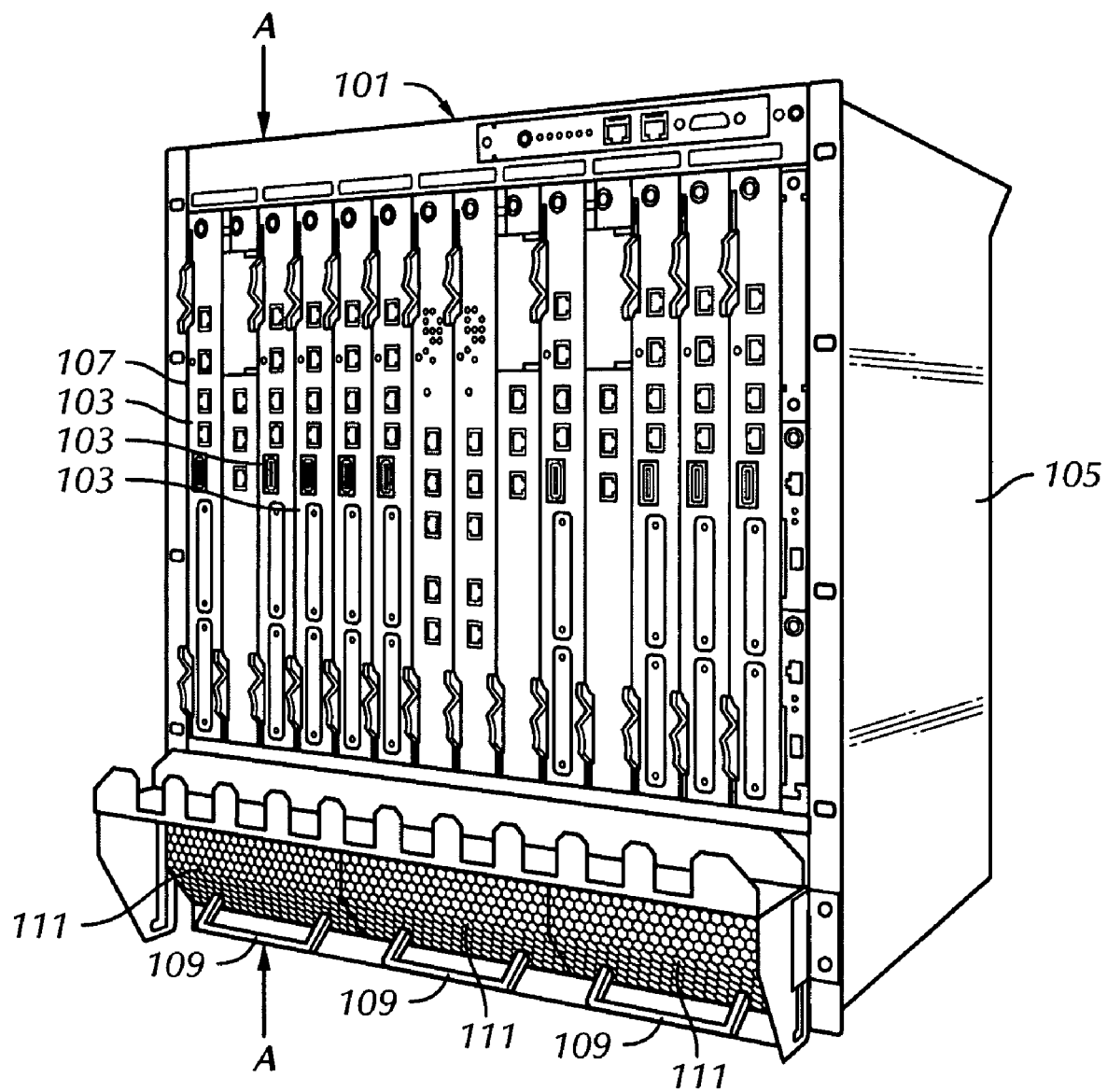
FIG. 1 shows a perspective view of a typical computer server with blade servers disposed therein.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 4:
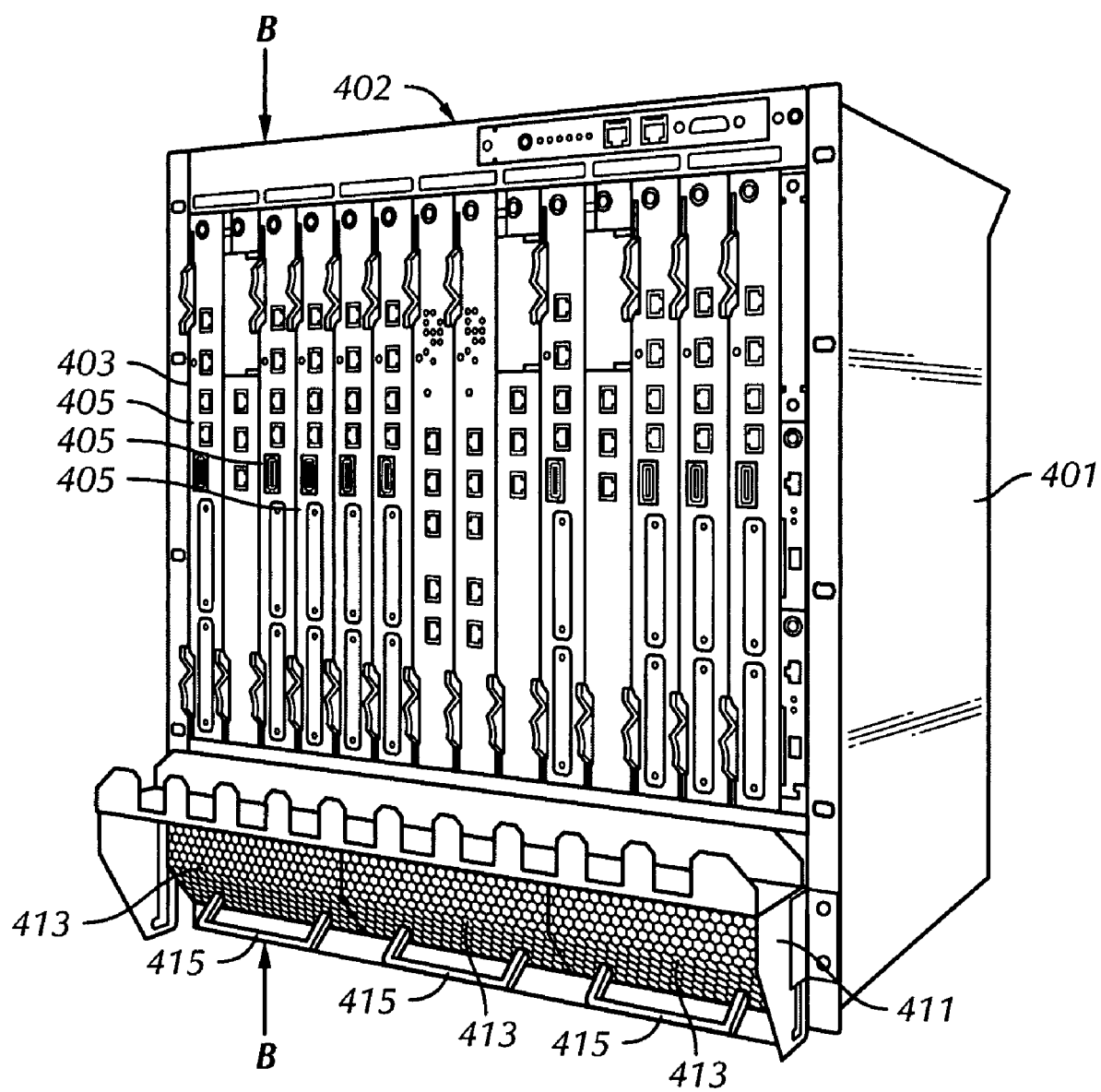
FIG. 4 shows a perspective view of a computer server with blade servers disposed therein in accordance with one or more embodiments of the present invention.
Figure 5:
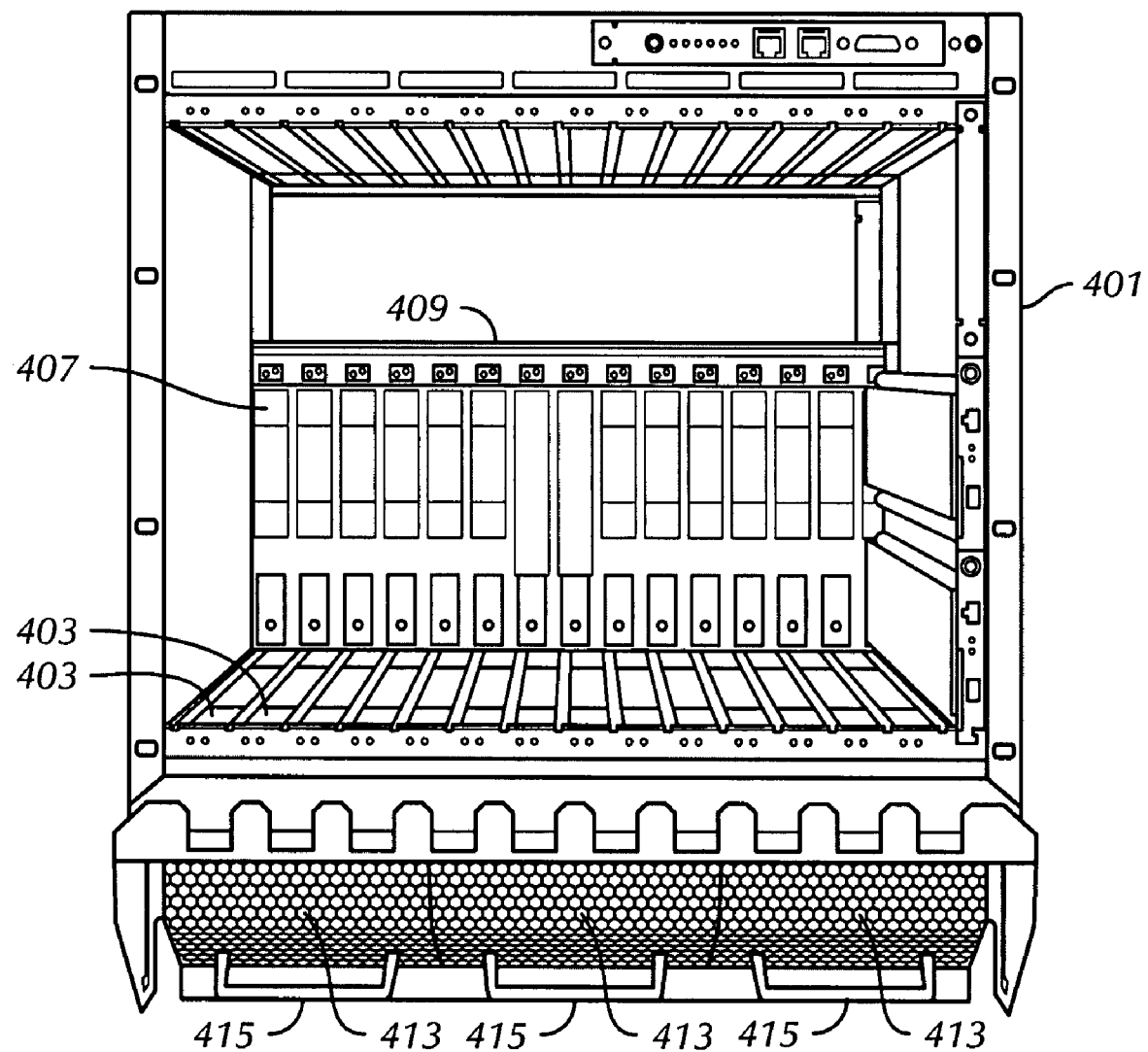
FIG. 5 shows a perspective view of a computer server in FIG. 4 where blade servers are removed.

FIG. 4 shows a perspective view of a computer server 402 with blade servers 405 disposed therein in accordance with one or more embodiments of the present invention. FIG. 5 shows a perspective view of a computer server 402 in FIG. 4 where blade servers 405 are removed. As can be seen in FIGS. 4 and 5, a chassis 401 has a plurality of slots 403 for blade servers 405 at the upper and front portion of the chassis 401. Each blade server 405 is removably attached to each slot 403 via each socket 407 disposed on a middle wall 409 of the chassis 401. Further, three fan trays 411 are removably disposed inside the chassis 401 under the slots 403. Although three fan trays 411 are shown in FIGS. 4 and 5, one of ordinary skill in the art will appreciate less or more numbers of fan trays are disposed in the chassis 401. The front plane of the fan tray 411 has an inlet 413 of an air, which is covered by a wire netting. Thus, an air is able to enter into the fan tray 411 through this inlet 413. Also, each fan tray 411 has a handle 415 at the front surface of the inlet 413 for removing the fan tray 411 from the chassis 401 by pulling the handle 415. Although the handle 415 is attached to the fan tray 411 via a wire netting, one of ordinary skill in the art will appreciate that the handle 415 is directly attached to each fan tray 411. The wire netting is perforated to allow an airflow therethrough, but each hole of the wire netting is not too wide to enable electromagnetic interference to radiate out from the chassis 401. Additionally, the chassis 401, the wire netting and the handle 415 is made of iron, aluminum or any other suitable material known in the art. Also, the end of the wire netting may be attached to the handle 415 by screws, adhesives, bonding or other attachment methods known in the art.

Figure 6:
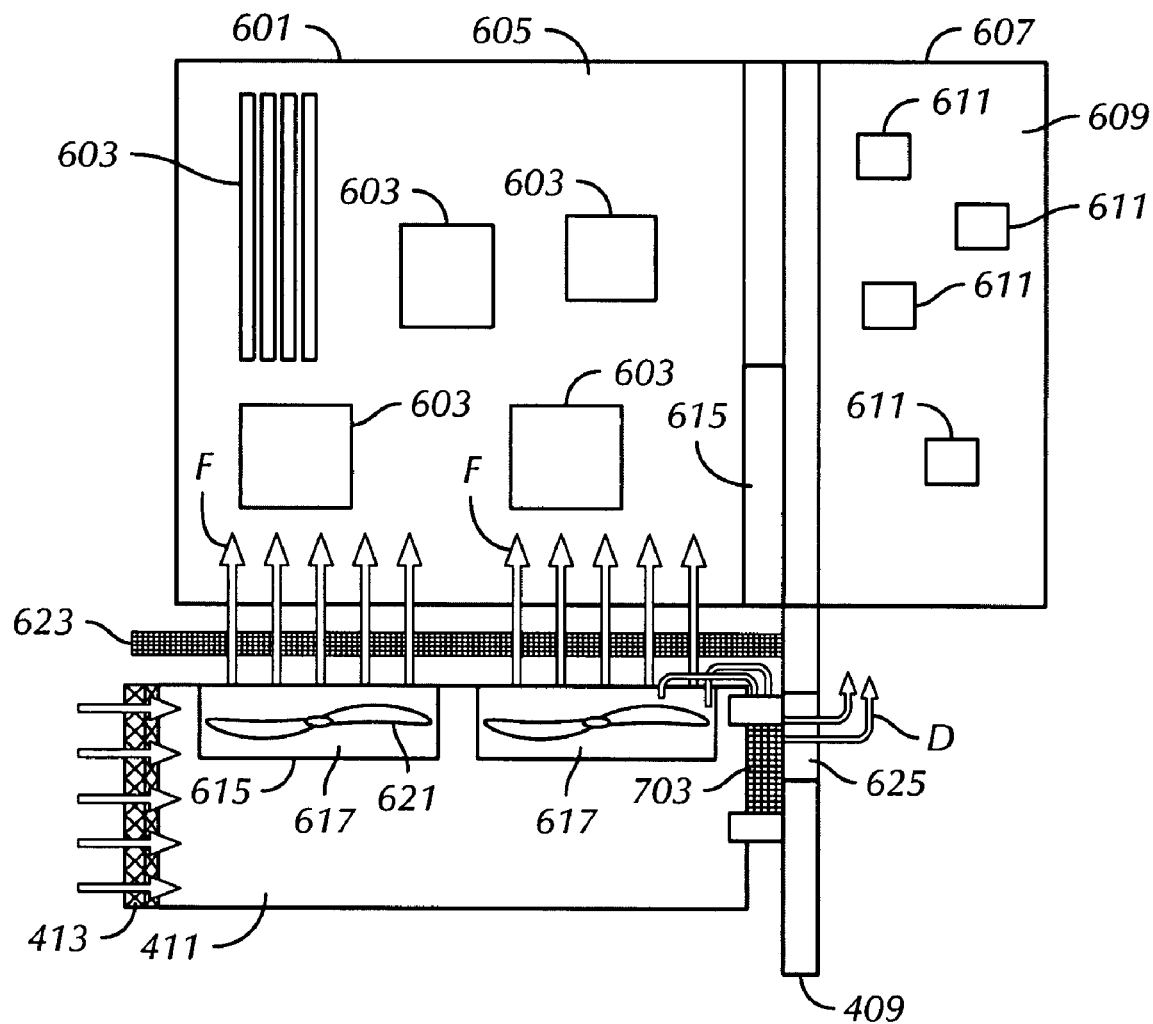
FIG. 6 shows a sectional view of the computer server along the line B-B of FIG. 4.

FIG. 6 shows a sectional view of the computer server 401 along the line B-B of FIG. 4. As can be seen in FIG. 6, the blade servers 405 in FIGS. 4 and 5 are constituted of a printed circuit board (PCB) assembly 601 including printed circuit board (PCB) 605 and various kinds of electric parts 603 such as semi-conductor chips and connectors. The blade servers 405 may also be covered by a housing (not shown). A rear PCB assembly 607 is constituted of a printed circuit board (PCB) assembly 607 including printed circuit board 609 and various kinds of electric parts 611. The rear PCB assembly 607 may also be covered by a housing (not shown). Additionally, active components are used in both the front PCB assembly 601 and the rear PCB assembly 607.

As can be seen in FIG. 6, the front PCB assembly 601 is disposed on the front surface of the middle plane 409 of the chassis 401 via a socket 407 so that the front PCB assembly 601 is removably disposed inside the chassis 401. On the other hand, the rear PCB assembly 607 is fixedly disposed on the rear surface of the middle plane 409. Although the rear PCB assembly 607 is fixedly disposed in this embodiment, one of ordinary skill in the art will appreciate that the rear PCB assembly 607 is removably disposed on the rear surface of the middle plane 409 via a socket (not shown) similar to the front PCB assembly 601 as explained above. Further, one of ordinary skill in the art will appreciate the other position of the socket 615 on the surface of the middle plane 409 so long as the front PCB assembly 601 is tightly held in the chassis 401.

Figure 7:
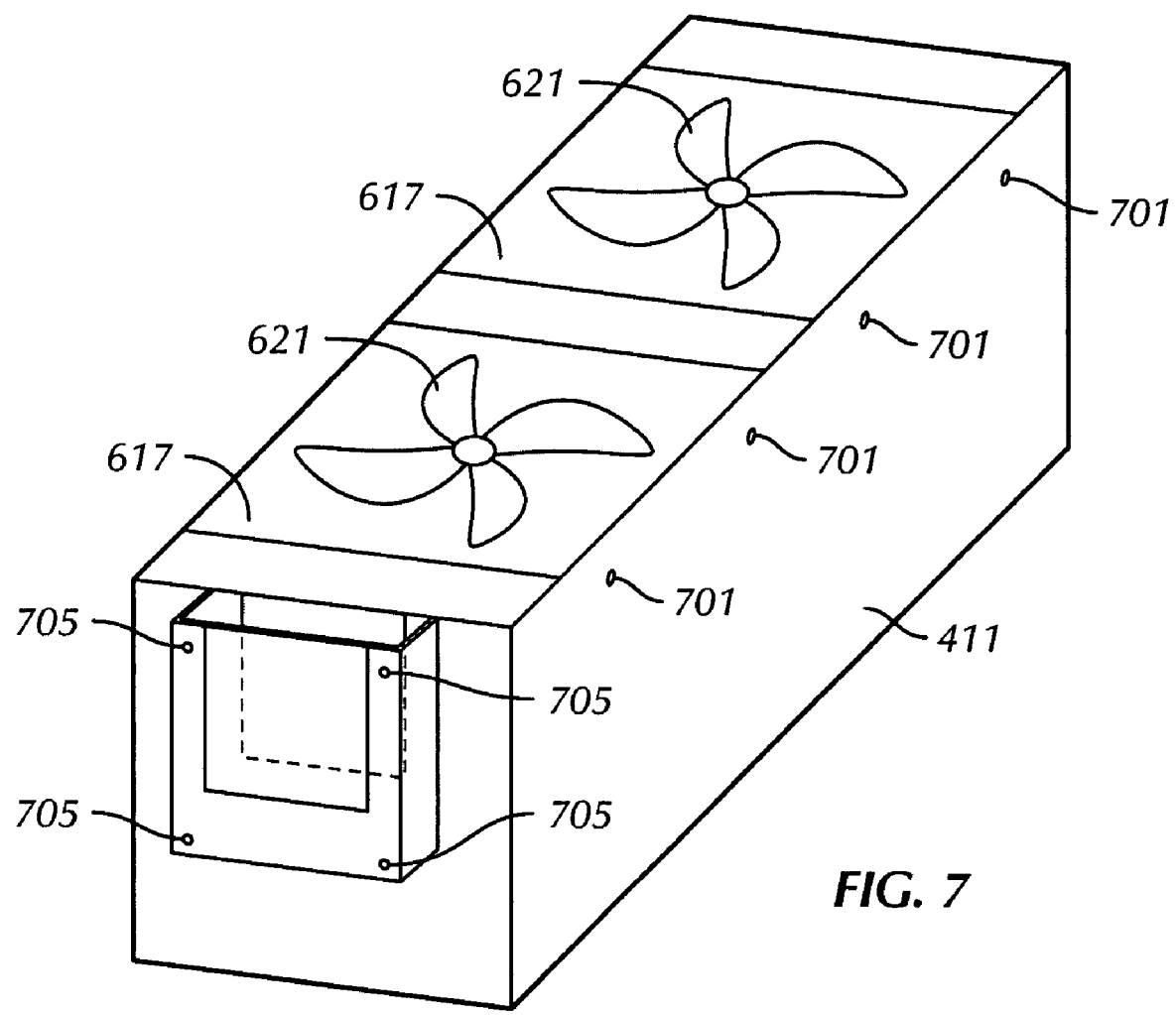
FIG. 7 shows a sectional view of the fan tray shown in FIGS. 4-6 from the back.

FIG. 7 shows a sectional view of the fan tray 411 shown in FIGS. 4-6 from the back. As shown in FIGS. 6 and 7, the inside of the fan tray 411 is hollow so that air can pass freely therethrough and each fan tray 411 is removably disposed inside the chassis 401 under the front PCB assembly 601 when the fan tray 411 is inserted. The fan tray 411 has two fans 617 in a row along the upper plate of the fan tray 411 at a useful distance from each other. Each fan 617 is a typical fan and has a casing 615, a fan blade 621 and a motor (not shown) to rotate the fan blade 621. The side plate of the casing 615 may be attached to the fan tray 411 by screws 701 or other attachment methods known in the art. Although each fan tray 411 includes two fans 617 in this embodiment, one of ordinary skill in the art will appreciate that the fan tray 411 may includes only one fan or more than two fans according to the size of the chassis and/or the energy consumption of the front PCB assembly 601 and the PCB assembly 607. Also, the position on which the fans 617 are disposed are not limited to those in FIGS. 6 and 7, and other position on the surface of upper plate of the fan tray 411 may be used, if such positions of the fans 617 enable the fan trays 411 to be inserted the chassis 401 appropriately and the fans 617 to provide enough air.

As shown in FIG. 6, a first air filter 623 is disposed between the front PCB assembly 601 and the fans 617 when the fan trays 411 are inserted in the chassis 401. The first filter 623 is removably fixed to the middle wall 409 of the chassis 401. The first filter 623 is removed at a maintenance service, and the service interval ranges, for example, from one month for dusty environmental air to one year for clean environmental air. The first air filter 623 filters the air from the fans 617 to the front PCB assembly 601. One of the ordinary skill in the art will appreciate that the first filter 623 is disposed at the fan tray 411 itself above the fans 617. Also, although the first filter 623 is one filter for a plurality of the fan trays 411 in FIG. 6, one of the ordinary skill in the art will appreciate a plurality of filters per one fan tray 411, one filter per one fan tray, or even one filter per each fan 617, if such filter or filters enables to filter the air to the first PCB assembly 601 appropriately.

As can be seen in FIG. 7, the fan tray 411 has an opening 629 at the rear plate of the fan tray 411. A second filter 703 is removably attached to the rear plate of the fan tray 411 at the end thereof tightly by screws 705, adhesives, bonding, or other attachment methods known in the art. Similarly to the first filter 623, the second filter 703 is removable at a maintenance service. The second filter 703 fully covers the opening 629 of the fan tray 411. Also, the middle wall 409 of the chassis 401 has an opening 625 at the lower portion of the middle wall 409 so that, when the fan tray 411 is inserted into the chassis 401 as shown in FIG. 6, the second filter 703 is situated on the opening 625 of the middle wall 409 to fully cover the opening 625. At this time, the second filter 703 is touched on the surface of the middle wall 409 around the opening 625. In other words, when the fan tray 411 is inserted into the chassis 401, there is no gap between the surface of the middle wall 409 and the surface of the second filter 703. Thus, only the filtered air by the second filter 703 is directed to the second rear PCB assembly 607. In addition, more than 80% of the dust arrestance of the second filter 703 may be preferable.

One of the ordinary skill in the art will appreciate any other shapes of the openings 625 and 629 and the second filter 703 so long as the second filter 703 is able to cover the whole openings 625 and 629. Also, although the fan tray 411 has the second filter 703 outside the fan tray 411 in this embodiment, one of ordinary skill in the art will appreciate that the second filter 703 is included inside the fan tray 411 so long as only the air filtered by the second filter 703 is directed to the second rear PCB assembly 607. Also, the position of the opening 629 is not limited to those in FIGS. 6 and 7, and other position on the surface of rear plate of the fan tray 417 may be used, if such positions of the fans enable the fan trays to be inserted the chassis 401 and the fans 617 to provide enough air to the rear PCB assembly 607 when inserted.

Figure 8:
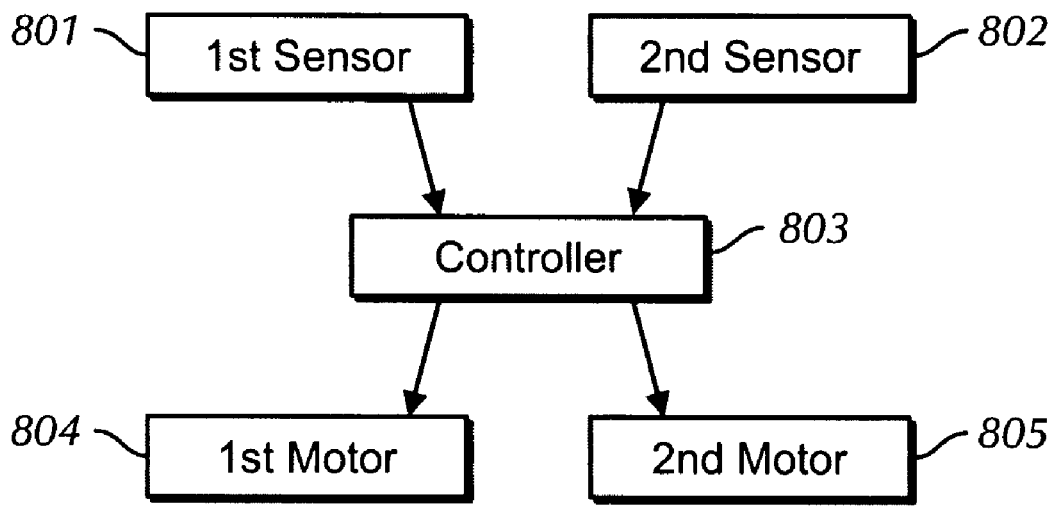
FIG. 8 shows a block diagram showing a circuit used to the server system in accordance with one or more embodiments of the present invention.

FIG. 8 shows a block diagram showing a circuit for controlling fans 617 in accordance with one or more embodiments of the present invention. As shown in FIG. 8, a first sensor 801 and a second sensor 802 are electrically connected to a controller 803. Also, a first motor 804 and a second motor 805 are electrically connected to the controller 803. The first motor 804 and second motor 805 rotate the blades 621 of the fans 617 respectfully. The first sensor 801 and the second sensor 802 are sensors for detecting temperatures. The first sensor 801 may be disposed at the slots 403 to detect the temperature of the blade servers 405. The second sensor 802 may be disposed at the rear of the middle wall 409 and inside the chassis 401 to detect the temperature of the rear PCB assemblies 607. One of the ordinary skill in the art will appreciate that other positions of the first and second sensor 801 and 802, if such positions do not prevent the front PCB assembly 601 and the rear PCB assembly 607 from being inserted and removed from the chassis 401.

Thus, the controller 803 controls the rotation speed of the first motor 804 and the second motor 805 respectively according to the temperatures detected by the first sensor 801 and the second sensor 802. For example, when the temperature of the rear PCB assembly 607 is higher than the predetermined temperature, the rotation speed of the motor that is close to the middle wall 409 is controlled to be faster to provide more air filtered by the second filter 703 to the rear PCB assembly 607. In addition, one of ordinary skill in the art will appreciate that the controller 803 controls the rotation speeds of the first motor 804 and the second motor 805 at the same speed according to the temperatures detected by the first sensor 801 and the second sensor 803.

In operation, as can be seen in arrows F and G in FIG. 6, most of the air from the inlet 413 is directed to the front PCB assembly 601 by the fans 617, while some of the air from the fans 617 is directed to the rear PCB assembly 607 by the fans 617.

Also, the air to the front PCB assembly 601 is filtered by the first air filter 623, while the air to the rear PCB assembly 607 is filtered by the second air filter 703. The arrows F and G describes only some flow of the air, the air flow should not limited to these arrows.

Thus, not only the air to the front PCB assembly 601 from the inlet 413 but also the air to the rear PCB assembly 607 is filtered so that the problems caused by the impacts of the unfiltered air flow to the rear PCB assembly 607 are prevented when the energy to be put into the rear PCB assembly 307 has increased as the new standard has evolved. Further, the second air filter 703 affects a wider area than afforded by the inlet holes at the middle plane. This allows greater air flow around the rear PCB assembly 607, while providing a larger area to collect dust which would make maintenance intervals longer.

Figure 2:
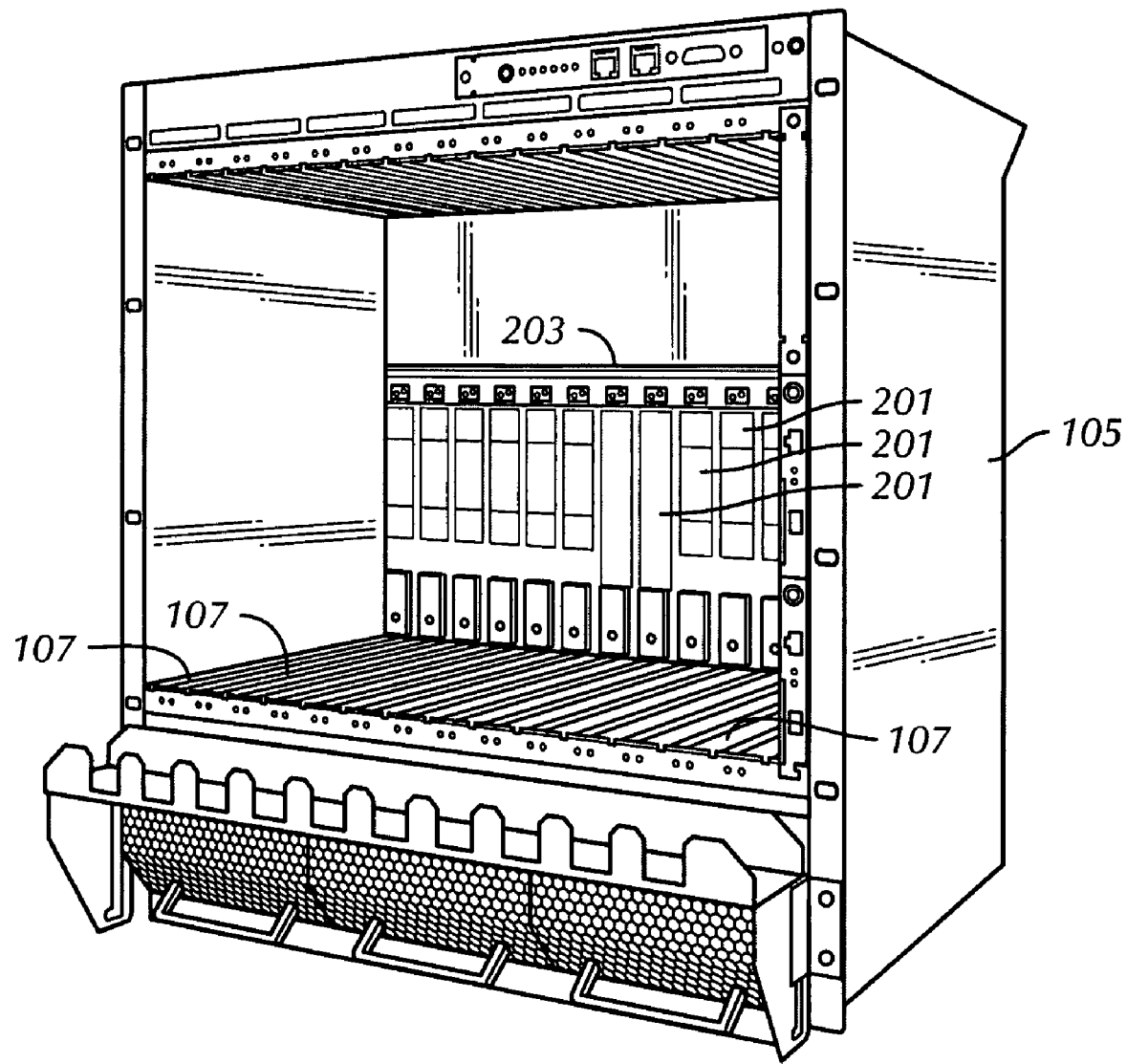
FIG. 2 shows a perspective view of a computer server in FIG. 1 where blade servers are removed.
Figure 3:
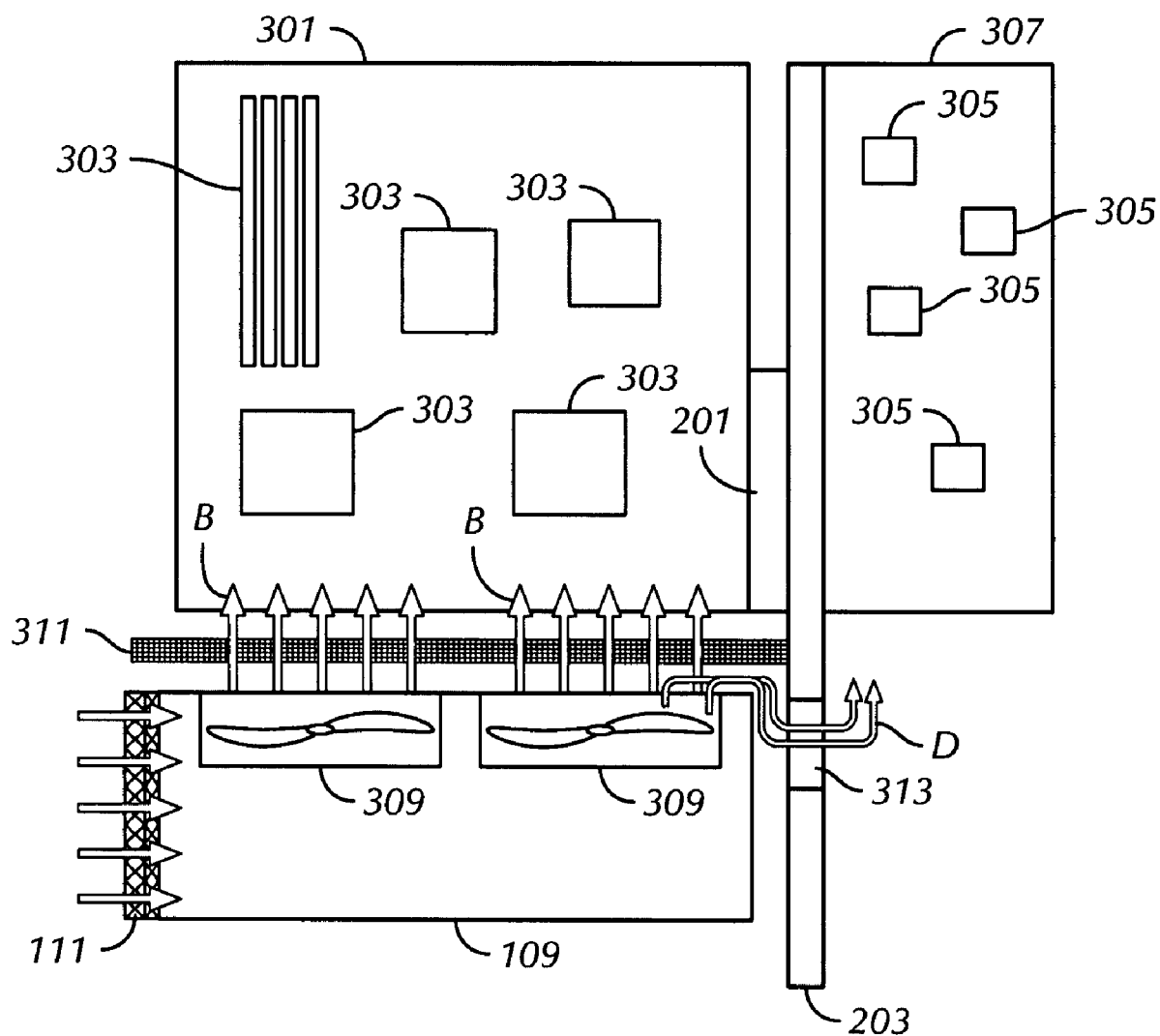
FIG. 3 shows a sectional view of computer server along the line A-A of FIG. 1.
Figure 9:
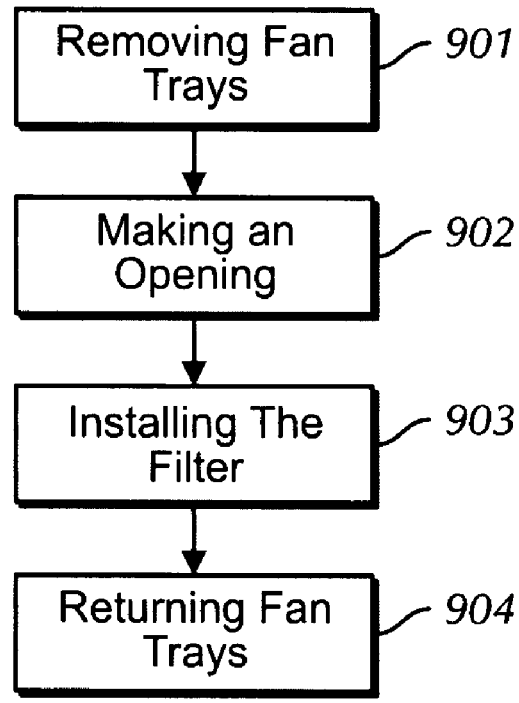
FIG. 9 shows a flow diagram of retrofitting the second filter to the computer server for the rear PCB assembly in accordance with one or more embodiments of the present invention.

FIG. 9 shows a flow diagram of retrofitting the second filter 703 to the computer server without the filter for the rear PCB assembly 607 as shown in FIGS. 1-3. In one or more embodiments of the invention, one or more of the steps described below may be omitted, repeated, and/or performed in a different order. Accordingly, the specific arrangement of steps shown in FIG. 9 should not be construed as limiting scope of the invention.

First, each fan tray 411 is removed from the chassis 401 by pulling the handle 415 (Step 901). As explained above, the fan tray 411 has the handle 415, so each fan tray 411 is easily removed. Next, the opening 629 of each fan tray 411 is made respectively at the rear plane of the fan tray 411 to install the second filter 703 by methods known in the art (Step 902). The size and width of the opening 629 are adjusted according to the size and width of the opening 625 of the middle wall 409 of the chassis 401 and the second filter 703 to be installed. Then, the second filter 703 is installed to each fan tray 411 to cover the opening 629 made (Step 903). The second filter 703 is attached to the fan tray 411 by screws, adhesives, bonding or other attachment methods known in the art to be held tightly by the fan tray. Finally, each fan tray 411, on which the second filter 703 was installed in Step 903, is returned to the chassis 411 (Step 904). When each fan tray 411 is returned, there are no gaps between the second air filter 703 and the surface of the middle wall 409 around the opening 625 of the middle wall so that only the air filtered by the second air filter 703 is directed to the rear PCB assembly 607 as shown in FIGS. 4-6.

Thus, when installing the second filter 703, all the fan trays 411 are removed from only the front side of the chassis 401, and, therefore, installing the second filter 703 to the computer server systems is easy and efficient. Also, the cost and time for installing the second filter 703 to the computer server are reduced because the whole chassis 401 of the computer server does not need to be replaced.

As an alternative, although FIGS. 4-6 show that the chassis 401 encloses the blade servers 405 at the upper portion of the chassis 401 and fan trays 411 at the lower portion of the chassis 401, one of ordinary skill in the art will appreciate that the chassis encloses blade servers 405 and the fan trays 411 at different positions. In that case, according to the positions of blade servers 405 and the fan trays 411, the positions of first and second filters 623 and 703, fans 617, openings 627 and 625 and the middle wall 409 are adjusted such that the first filter 623 and the second filter 703 provide the appropriate filtered air to the front PCB assembly 605 and the rear PCB assembly 607 respectively in the light of the explanation above.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for cooling a computer system, comprising:
   a fan for flowing an air to a first assembly and a second assembly;
   a first filter for filtering an air to a first assembly; and
   a second filter for filtering an air to a second assembly,
   wherein the first assembly and the second assembly are separated by a wall such that air passing through the first filter enters only the first assembly and air passing through the second filter enters only the second assembly, and
   wherein the first filter is disposed at a side of the first assembly and the second filter is disposed on an opening of the wall which separates the first assembly and the second assembly.

2. The apparatus of claim 1, wherein an axis of the air from the fan is directed to the first assembly.

3. The apparatus of claim 2, wherein an axis of the air passing through the opening in the wall which separates the first assembly and the second assembly is at 90 degrees with respect to the axis of the air from the fan.

4. The apparatus of claim 1, further comprising a fan tray enclosing the fan and having an air inlet.

5. The apparatus of claim 4, wherein the inlet is located at a front of the fan tray.

6. The apparatus of claim 4, further comprising a chassis for enclosing the first assembly, the second assembly and the fan tray, wherein the wall is included by the chassis.

7. The apparatus of claim 1, further comprising:
   a first sensor for detecting a temperature around the first assembly;
   a second sensor for detecting a temperature around the second assembly; and
   a controller for controlling a rotation speed of the fan responsive to the temperatures detected by the first sensor and the second sensor.

8. The apparatus of claim 1, wherein the second filter has more than 80% dust arrestance.

9. An apparatus for cooling a computer system, comprising:
   a fan for flowing an air to a first assembly and a second assembly;
   a first filter for filtering an air to a first assembly;

a second filter for filtering an air to a second assembly; and
a wire netting which covers the inlet,
wherein the first filter is disposed at a side of the first assembly and the second filter is disposed on an opening of a wall which separates the first assembly and the second assembly,
wherein the inlet is located at a front of the fan tray.

10. The apparatus of claim 9, further comprising a handle disposed on the wire netting.

11. The apparatus of claim 10, wherein the fan tray is removably enclosed inside of the chassis.

12. The apparatus of claim 10, wherein the first assembly is removably attached to the wall via a socket inside the chassis.

13. The apparatus of claim 10, wherein the chassis encloses the fan tray at the lower portion of the chassis and encloses the first assembly above the fan tray.

14. An apparatus for cooling a computer system, comprising:
a fan for flowing an air to a first assembly and a second assembly;
a first filter for filtering an air to a first assembly;
a second filter for filtering an air to a second assembly; and
a fan tray enclosing the fan and having an air inlet,
wherein the first filter is disposed at a side of the first assembly and the second filter is disposed on an opening of a wall which separates the first assembly and the second assembly, and
wherein the second filter is disposed on the fan tray.

* * * * *